United States Patent
Fujii et al.

(10) Patent No.: US 9,063,004 B2
(45) Date of Patent: Jun. 23, 2015

(54) PACKAGE MEMBER FOR ELECTRONIC COMPONENT AND OPTICAL DEVICE INCLUDING THE PACKAGE MEMBER

(75) Inventors: Toshishige Fujii, Miyagi (JP); Satoru Sugawara, Miyagi (JP)

(73) Assignee: RICOH COMPANY, LTD., Tokyo (JP)

(*) Notice: Subject to any disclaimer, the term of this patent is extended or adjusted under 35 U.S.C. 154(b) by 316 days.

(21) Appl. No.: 13/602,645

(22) Filed: Sep. 4, 2012

(65) Prior Publication Data

US 2013/0062510 A1  Mar. 14, 2013

(30) Foreign Application Priority Data

Sep. 8, 2011 (JP) ................. 2011-195668
Jun. 7, 2012 (JP) ................. 2012-129574

(51) Int. Cl.
*H01J 5/02* (2006.01)
*G01J 1/04* (2006.01)
*H01S 5/022* (2006.01)
*H01S 5/0683* (2006.01)
*H01S 5/42* (2006.01)

(52) U.S. Cl.
CPC .......... *G01J 1/0403* (2013.01); *H01S 5/02236* (2013.01); *H01S 5/02248* (2013.01); *H01S 5/02296* (2013.01); *H01S 5/0683* (2013.01); *H01S 5/423* (2013.01)

(58) Field of Classification Search
CPC ........................... G01J 1/0403; H01S 5/02296
USPC .......................................... 250/239; 257/703
See application file for complete search history.

(56) References Cited

U.S. PATENT DOCUMENTS

| 2009/0296762 A1 | 12/2009 | Yamaguchi |
| 2012/0162723 A1 | 6/2012 | Fujii |
| 2013/0301257 A1* | 11/2013 | Britt et al. ............. 362/231 |

FOREIGN PATENT DOCUMENTS

| JP | 10-215020 | 8/1998 |
| JP | 10-326951 | 12/1998 |
| JP | 2000-250118 | 9/2000 |
| JP | 2002-178325 | 6/2002 |
| JP | 2002-289748 | 10/2002 |
| JP | 2002-299818 | 10/2002 |
| JP | 2008-311499 | 12/2008 |
| JP | 2009-105240 | 5/2009 |
| JP | 2010-010660 | 1/2010 |
| JP | 4552443 | 7/2010 |
| JP | 2011-119496 | 6/2011 |
| JP | 2011-198857 | 10/2011 |

* cited by examiner

*Primary Examiner* — Thanh Luu
(74) *Attorney, Agent, or Firm* — Cooper & Dunham LLP

(57) ABSTRACT

A ceramic package includes a chip mounting portion, a photodiode (PD) mounting portion, a plurality of connecting terminals, and a gold-plated portion. The chip mounting portion is a portion on which a surface-emitting laser array chip is mounted on a first ceramic layer. The PD mounting portion is provided to a second ceramic layer stacked on the positive side in a c-axis direction of the first ceramic layer. Openings are formed at four corners of the PD mounting portion. A scale is formed on a portion that can be observed through the opening of the second ceramic layer on the surface of the positive side in the c-axis direction of the first ceramic layer.

19 Claims, 28 Drawing Sheets

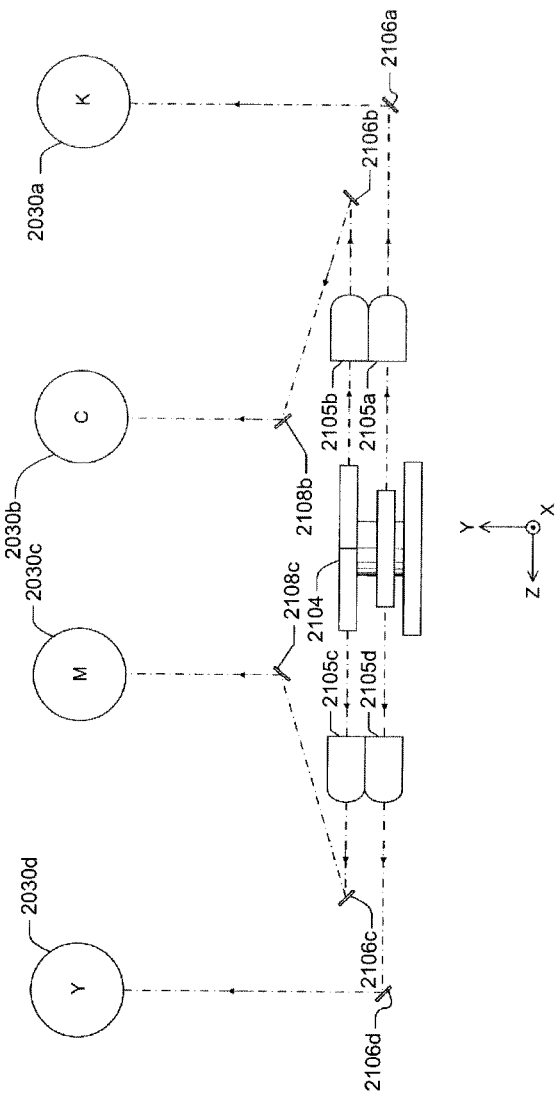

PACKAGE MEMBER FOR ELECTRONIC COMPONENT AND OPTICAL DEVICE INCLUDING THE PACKAGE MEMBER

CROSS-REFERENCE TO RELATED APPLICATIONS

The present application claims priority to and incorporates by reference the entire contents of Japanese Patent Application No. 2011-195668 filed in Japan on Sep. 8, 2011 and Japanese Patent Application No. 2012-129574 filed in Japan on Jun. 7, 2012.

BACKGROUND OF THE INVENTION

1. Field of the Invention

The present invention relates to a package member and an optical device, and more particularly to a package member that holds an electronic component and an optical device including the package member.

2. Description of the Related Art

Typically, a ceramics package, which has excellent heat dissipation, is used for a package member that holds an electronic component and a semiconductor element, for example.

Japanese Patent Application Laid-open No. 10-215020, for example, discloses an all-in-one laser-base light source including a package, an optical sensor unit, a laser, and a convex beam splitting surface unit.

Japanese Patent Application Laid-open No. 2009-105240 discloses a semiconductor light-emitting device including a semiconductor light-emitting element in which resistive has negative temperature characteristics, a resistive element electrically connected to the semiconductor light-emitting element in series, and a board to which the semiconductor light-emitting element and the resistive element are fixed. In the resistive element, resistance has positive temperature characteristics.

Japanese Patent Application Laid-open No. 2002-173325 discloses a method for manufacturing a ceramic laminate including: forming a recognition mark on an inner ceramic green sheet; forming a window frame opening larger than the recognition mark at a position where the recognition mark is exposed on an outer ceramic green sheet; aligning and stacking the inner ceramic green sheet and the outer ceramic green sheet; forming a break line using the recognition mark on the inner layer exposed through the window frame opening on the outer layer as an alignment guide; and sintering the ceramic green sheets that are stacked and on which the break line is formed.

However, in the conventional package member, it is difficult to quantitatively derive positional deviation between layers in a simple manner.

SUMMARY OF THE INVENTION

It is an object of the present invention to at least partially solve the problems in the conventional technology.

A package member includes a stacked ceramic layers including at least a first ceramic layer and a second ceramic layer stacked on the first ceramic layer, on which an electronic component is to be mounted, at least one mark for detecting a position being formed on the first ceramic layer, and at least one portion defining an opening for observing the at least one mark being provided to the second ceramic layer.

An optical device includes a package member including a stacked ceramic layers including at least a first ceramic layer and a second ceramic layer stacked on the first ceramic layer, at least one mark for detecting a position being formed on the first ceramic layer, and at least one portion defining an opening for observing the at least one mark being provided to the second ceramic layer, a surface-emitting laser element provided to the first ceramic layer, a transparent member that is tilted with respect to an output surface of the surface-emitting laser element and that reflects a part of light output from the surface-emitting laser element; and a photodiode that is provided to the second ceramic layer and that receives the light reflected by the transparent member.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a fourth view for explaining the optical scanning device in FIG. 1;

DETAILED DESCRIPTION OF THE PREFERRED EMBODIMENTS

Figure 1:
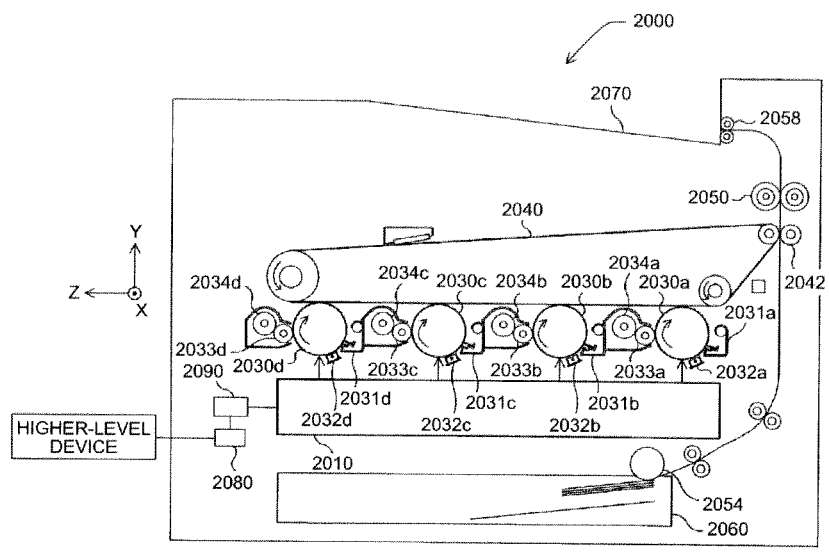
FIG. 1 is a view for explaining a schematic configuration of a color printer according to an embodiment of the present invention.
Figure 2:
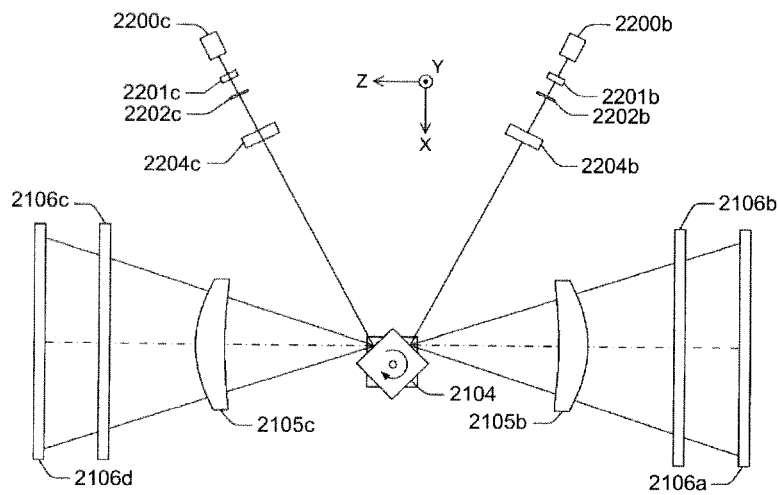
FIG. 2 is a first view for explaining an optical scanning device in FIG. 1.
Figure 3:
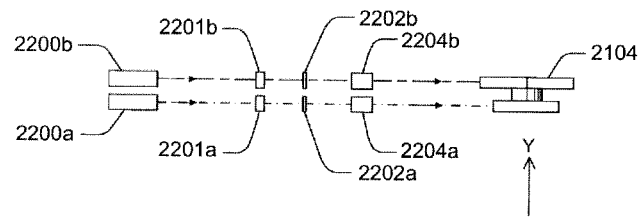
FIG. 3 is a second view for explaining the optical scanning device in FIG. 1.
Figure 4:
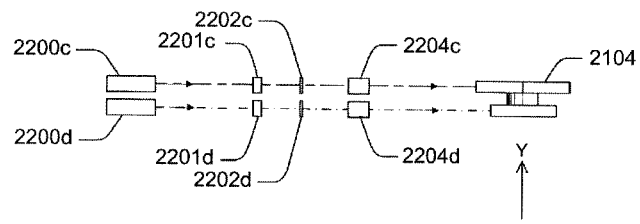
FIG. 4 is a third view for explaining the optical scanning device in FIG. 1.

Exemplary embodiments according to the present invention are described below with reference to FIG. 1 to FIG. 40B. FIG. 1 is a schematic of a configuration of a color printer 2000 according to an embodiment.

The color printer 2000 is a tandem-type multicolor printer that forms a full-color image by superimposing four colors (black, cyan, magenta, and yellow). The color printer 2000 includes an optical scanning device 2010, four photosensitive drums (2030a, 2030b, 2030c, and 2030d), four cleaning units (2031a, 2031b, 2031c, and 2031d), four charging devices (2032a, 2032b, 2032c, and 2032d), four developing rollers (2033a, 2033b, 2033c, and 2033d), four toner cartridges (2034a, 2034b, 2034c, and 2034d), a transfer belt 2040, a transfer roller 2042, a fixing device 2050, a paper feeding roller 2054, a discharging roller 2058, a paper feed tray 2060, a discharge tray 2070, a communication control device 2080, and a printer control device 2090 that controls these components collectively.

In the description, a direction along the longitudinal direction (rotating shaft direction) each of the photosensitive drums is an X-axis direction, and a direction along the arrangement direction of the four photosensitive drums is a Z-axis direction in an X-Y-Z three-dimensional orthogonal coordinate system.

The communication control device 2080 controls two-way communications with a higher-level device (e.g., a personal computer) via a network, for example.

The printer control device 2090 includes a central processing unit (CPU), a read-only memory (ROM) storing therein a computer program described in a CPU-decodable code and various types of data used for executing the computer program, a random access memory (RAM) serving as a working memory, and an analog-digital (AD) converter circuit that converts analog data to digital data, for example. The printer control device 2090 notifies the optical scanning device 2010 of multicolor image information received from the higher-level device via the communication control device 2080.

The photosensitive drum 2030a, the charging device 2032a, the developing roller 2033a, the toner cartridge 2034a, and the cleaning unit 2031a are used as a group, and constitute an image forming station that forms a black image (hereinafter, referred to as a "K station" for convenience).

The photosensitive drum 2030b, the charging device 2032b, the developing roller 2033b, the toner cartridge 2034b, and the cleaning unit 2031b are used as a group, and constitute an image forming station that forms a cyan image (hereinafter, referred to as a "C station" for convenience).

The photosensitive drum 2030c, the charging device 2032c, the developing roller 2033c, the toner cartridge 2034c, and the cleaning unit 2031c are used as a group, and constitute an image forming station that forms a magenta image (hereinafter, referred to as an "N station" for convenience).

The photosensitive drum 2030d, the charging device 2032d, the developing roller 2033d, the toner cartridge 2034d, and the cleaning unit 2031d are used as a group, and constitute an image forming station that forms an yellow image (hereinafter, referred to as a "Y station" for convenience).

A photosensitive layer is formed on the surface of each of the photosensitive drums. In other words, the surface of each of the photosensitive drums functions as a scanned surface. Each of the photosensitive drums is rotated in an arrow direction on the plane in FIG. 1 by a rotating mechanism, which is not illustrated.

Each of the charging devices uniformly charges the surface of the photosensitive drum corresponding thereto.

The optical scanning device 2010 uses a light beam modulated for each color based on multicolor image information (black image information, cyan image information, magenta image information, and yellow image information) received from the printer control device 2090 to scan the surface of the photosensitive drum thus charged corresponding to each color. Thus, a latent image corresponding to the image information is formed on the surface of each of the photosensitive drums. The latent image thus formed moves toward the developing roller corresponding to each photosensitive drum in association with rotation of the photosensitive drum. The configuration of the optical scanning device will be described later.

In association with rotation of each of the developing rollers, toner supplied from the toner cartridge corresponding thereto is applied thinly and evenly to the surface of each of the developing rollers. When the toner on the surface of each of the developing rollers comes into contact with the surface of the photosensitive drum corresponding thereto, the toner moves only to the portion irradiated with light on the surface, and adheres to the portion. In other words, each of the developing rollers causes the toner to adhere to the latent image formed on the surface of the photosensitive drum corresponding thereto, thereby developing the image. The image to which the toner adheres (toner image) moves toward the transfer belt 2010 in association with rotation of the photosensitive drum.

Each of the toner in yellow, magenta, cyan, and black is sequentially transferred onto the transfer belt 2040 at a predetermined timing, and is superimposed to form a color image.

The paper feed tray 2060 houses recording sheets. The paper feeding roller 2059 is arranged near the paper feed tray 2060, and takes out the recording sheets one by one from the paper feed tray 2060. The recording sheet is fed into a gap between the transfer belt 2040 and the transfer roller 2012 at a predetermined timing. As a result, the color image on the transfer belt 2040 is transferred onto the recording sheet. The recording sheet onto which the color image is transferred is fed to the fixing device 2050.

The fixing device 2050 applies heat and pressure to the recording sheet to fix the toner on the recording sheet. The recording sheet on which the toner is fixed is fed to the discharge tray 2070 via the discharging roller 2058, and is sequentially stacked on the discharge tray 2070.

Each of the cleaning units removes toner (residual toner) remaining on the surface of the photosensitive drum corresponding thereto. The surface of the photosensitive from which the residual toner is removed is returned to the position opposite to the charging device corresponding thereto.

The configuration of the optical scanning device 2010 will now be described.

As illustrated in FIG. 2 to FIG. 5, for example, the optical scanning device 2010 includes four light sources (2200a, 2200b, 2200c, and 2200d), four coupling lenses (2201a, 2201b, 2201c, and 2201d), four aperture plates (2202a, 2202b, 2202c, and 2202d), four cylindrical lenses (2204a, 2204b, 2204c, and 2204d), a light deflector 2104, four scanning lenses (2105a, 2105b, 2105c, and 2105d), six reflecting mirrors (2106a, 2106b, 2106c, 2106d, 2108b, and 2108c), and a scanning control device, which is not illustrated.

In the description below, a direction corresponding to the main-scanning direction is simply referred to as a "main-scanning corresponding direction", and a direction corresponding to the sub-scanning direction is simply referred to as a "sub-scanning corresponding direction" for convenience.

The light source 2200a, the coupling lens 2201a, the aperture plate 2202a, the cylindrical lens 2204e, the scanning lens 2105a, and the reflecting mirror 2106a are optical members for forming a latent image on the photosensitive drum 2030a.

The light source 2200b, the coupling lens 2201h, the aperture plate 2202h, the cylindrical lens 2204b, the scanning lens 2105b, the reflecting mirror 2106b, and the reflecting mirror 2108b are optical members for forming a latent image on the photosensitive drum 2030b.

The light source 2200c, the coupling lens 2201c, the aperture plate 2202c, the cylindrical lens 2204c, the scanning lens 2105c, the reflecting mirror 2106c, and the reflecting mirror 2108c are optical members for forming a latent image on the photosensitive drum 2030c.

The light source 2200d, the coupling lens 2201d, the aperture plate 2202d, the cylindrical lens 2204d, the scanning lens 2105d, and the reflecting mirror 2106d are optical members for forming a latent image on the photosensitive drum 2030d.

Each of the coupling lenses is arranged on the optical path of the light beam output from the light source corresponding thereto, and makes the light beam approximately parallel.

Each of the aperture plates has an aperture, and shapes the light beam passing through the coupling lens corresponding thereto.

Each of the cylindrical lenses focuses the light beam output from a light source unit corresponding thereto near the deflecting reflecting surface of the light deflector 2104 with respect to a Y-axis direction.

The light deflector 2104 includes a two-tiered polygon mirror. Each of the polygon mirrors has four deflecting reflecting surfaces. The first (lower) polygon mirror deflects the light beam output from the cylindrical lens 2204a and the light beam output from the cylindrical lens 2204d. By contrast, the second (upper) polygon mirror deflects the light beam output from the cylindrical lens 2204b and the light beam output from the cylindrical lens 2204c. The first polygon mirror and the second polygon out of phase with each other by approximately 45 degrees, and perform write scanning alternately.

The light beam output from the cylindrical lens 2204a and deflected by the light deflector 2104 is output to the photosensitive drum 2030a via the scanning lens 2105a and the reflecting mirror 2106a to form a light spot. The light spot moves in the longitudinal direction of the photosensitive drum 2030a in association with rotation of the light deflector 2104.

The light beam output from the cylindrical lens 2204b and deflected by the light deflector 2104 is output to the photosensitive drum 2030b via the scanning lens 2105b and two reflecting mirrors (2106b and 2108b) to form a light spot. The light spot moves in the longitudinal direction of the photosensitive drum 2030b in association rotation of the light deflector 2104.

The light beam output from the cylindrical lens 2204c and deflected by the light deflector 2104 is output to the photosensitive drum 2030c via the scanning lens 2105c and two reflecting mirrors (2106c and 2108c) to form a light spot. The light spot moves in the longitudinal direction of the photosensitive drum 2030c in association with rotation of the light deflector 2104.

The light beam output from the cylindrical lens 2204d and deflected by the light deflector 2104 is output to the photosensitive drum 2030d via the scanning lens 2105d and the reflecting mirror 2106d to form a light spot. The light spot moves in the longitudinal direction of the photosensitive drum 2030d in association with rotation of the light deflector 2104.

The movement direction of the light spot on each of the photosensitive drums is the "main-scanning direction", whereas the rotation direction of the photosensitive drum is the "sub-scanning direction".

The optical system arranged on the optical path between the light deflector 2104 and each of the photosensitive drums is also referred to as a scanning optical system.

Figure 6A:
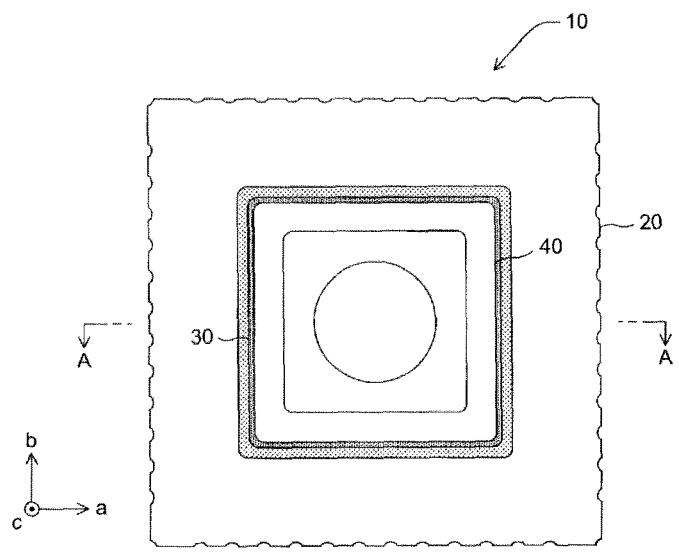
FIG. 6A and FIG. 6B are views for explaining an optical device.
Figure 6B:
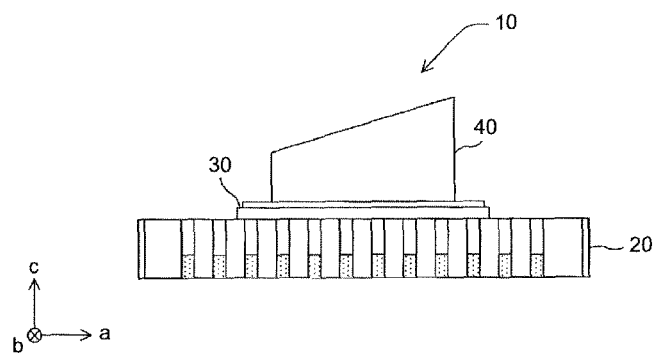
Figure 7:
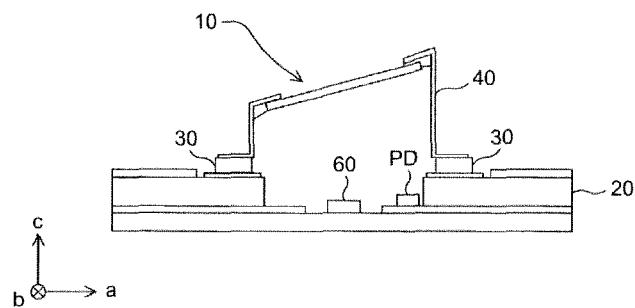
FIG. 7 is a sectional view along line A-A of FIG. 6A.

As illustrated in FIG. 6A to FIG. 7, for example, each of the light sources includes an optical device 10. FIG. 7 is a sectional view along line A-A of FIG. 6A.

The optical device 10 includes a flat package 20, a metal ring 30, a cap 40, a surface-emitting laser array chip 60, and a photodiode PD.

A direction orthogonal to the bottom surface of the flat package 20 is a c-axis direction, and two directions orthogonal to each other in a plane orthogonal to the c-axis direction are an a-axis direction and a b-axis direction. The a-axis direction corresponds to the main-scanning corresponding direction, whereas the b-axis direction corresponds to the sub-scanning corresponding direction.

Figure 8:
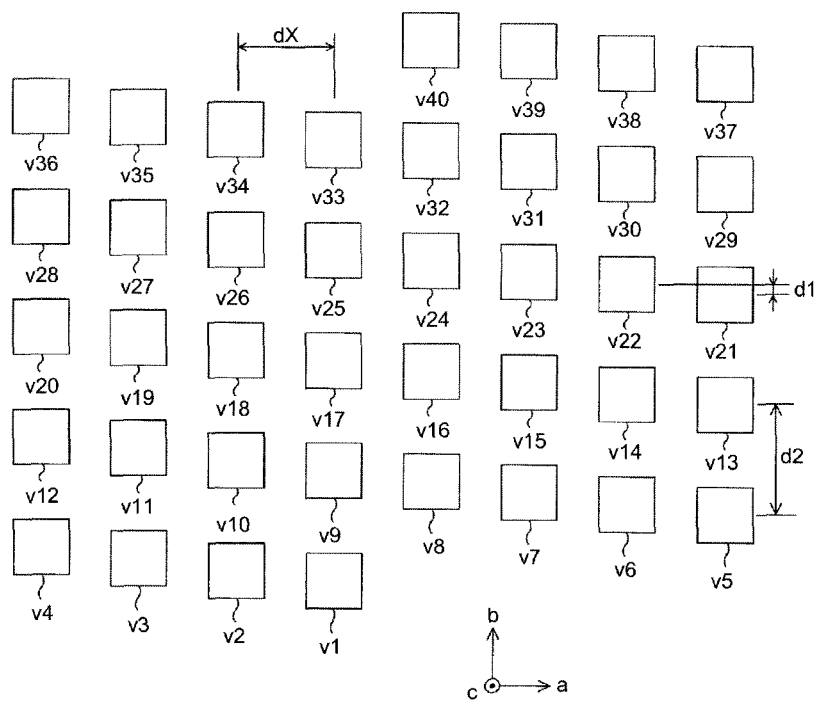
FIG. 8 is a view for explaining a surface-emitting laser array chip.

As illustrated in FIG. 8, for example, the surface-emitting laser array chip 60 includes 40 light-emitting elements v1 to v40 arranged two-dimensionally. The number of light-emitting elements is not restricted to 40.

Interval between the light-emitting elements being adjacent each other along the a-axis direction are equal to one another ("dX" in FIG. 8), and interval between the light-emitting elements being adjacent each other along the b-axis direction are also equal to one another ("d2" in FIG. 8). And the 40 light-emitting elements are arranged such that intervals between the light-emitting elements are equal to one another ("d1" in FIG. 8) if all the light-emitting elements are orthographically projected onto a virtual line extending in the sub-scanning corresponding direction. In the present specification, the "interval between the light-emitting elements" is a center-to-center distance of two light-emitting elements being adjacent each other.

A vertical cavity surface-emitting laser (VCSEL) with an emission wavelength of 780 nm band is used as each of the light-emitting elements. In other words, the surface-emitting laser array chip 60 is composed of 40 surface-emitting lasers.

The surface-emitting laser array chip 60 includes 40 light-emitting elements and has many terminals. As a result, it is extremely difficult to house the surface-emitting laser array chip 60 in a so-called can package. To address this, the surface-emitting laser array chip 60 is housed in the flat package 20 that enables surface mounting and that facilitates taking out of a terminal serving as a lead.

Figure 9:
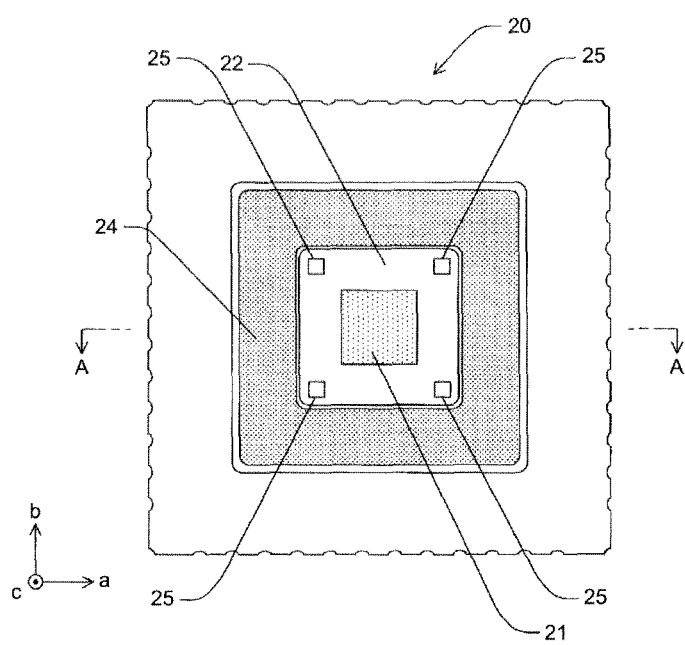
FIG. 9 is a plan view of a flat package.
Figure 10:
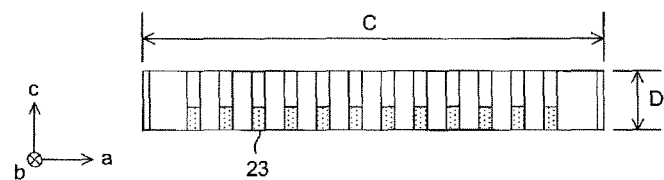
FIG. 10 is a side view of the flat package.
Figure 11:
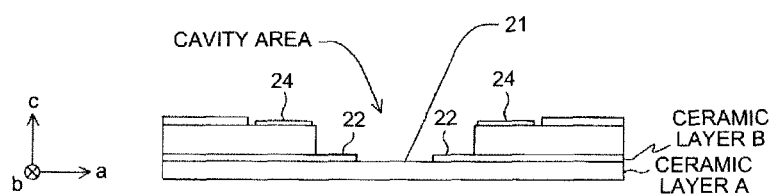
FIG. 11 is a sectional view along line A-A of FIG. 9.

The flat package 20 is a flat package referred to as a ceramic leaded chip carrier (CLCC). As illustrated in FIG. 9 to FIG. 11, for example, the flat package 20 includes a chip mounting portion 21, a PD mounting portion 22, a plurality of connecting terminals 23, and a gold-plated portion 24. FIG. 11 is a sectional view along line A-A of FIG. 9. The flat; package 20 is formed of a plurality of ceramic layers.

The flat package 20 has a recess referred to as a cavity area on the surface of the positive side in the c-axis direction.

The chip mounting portion 21 is a portion on which the surface-emitting laser array chip 60 is mounted, and is the bottom surface of the cavity area. The chip mounting portion 21 is provided with a metal film. The metal film is also referred to as a die attach area, and functions as a common electrode.

The surface-emitting laser array chip 60 is die-bonded approximately to the center of the chip mounting portion 21 on the metal film using a solder material such as AuSn. In other words, the surface-emitting laser array chip 60 is held on the bottom surface of the cavity area surrounded by walls.

A plurality of lead terminals, which are not illustrated, extend radially from the chip mounting portion 21 toward the outer periphery of the flat package 20. The lead terminals are electrically connected to a plurality of terminals of the surface-emitting laser array chip 60 by bonding wires.

In the description below, the ceramic layer to which the chip mounting portion 21 is provided is also referred to as a "ceramic layer A" for convenience.

The PD mounting portion 22 is provided to a ceramic layer (hereinafter, also referred to as a "ceramic layer B" for convenience) stacked on the positive side in the c-axis direction of the ceramic layer A. Openings 25 are formed at four corners of the PD mounting portion 22.

The photodiode PD is die-bonded to the PD mounting portion 22. An anode electrode of the photodiode PD is electrically connected to the lead terminal by a bonding wire. A cathode on the rear surface of the photodiode PD electrically connected to ground (GND) via an electrically conductive adhesive. In other words, the surface-emitting laser array chip 60 and the photodiode PD are held on different ceramic layers.

The connecting terminals 23 are terminals that electrically connect the surface-emitting laser array chip 60 and a printed circuit board and the like, and are also referred to as a castellation. The connecting terminals 23 are electrically connected to the lead terminals individually.

The gold-plated portion 24 is provided in a manner surrounding the cavity area. The gold-plated portion 24 is formed by electroplating that achieves finer plating and higher adhesion than non-electrolytic plating. As a result, it is possible to make the inside of the cap 40 more airtight. The plating thickness of the gold-plated portion 24 is approximately 1 μm.

The outline of the flat package 20 is a square with a side length C (refer to FIG. 10) of approximately 13.2 mm. A thickness D (refer to FIG. 10) of the flat package 20 is approximately 2.18 mm.

Figure 12:
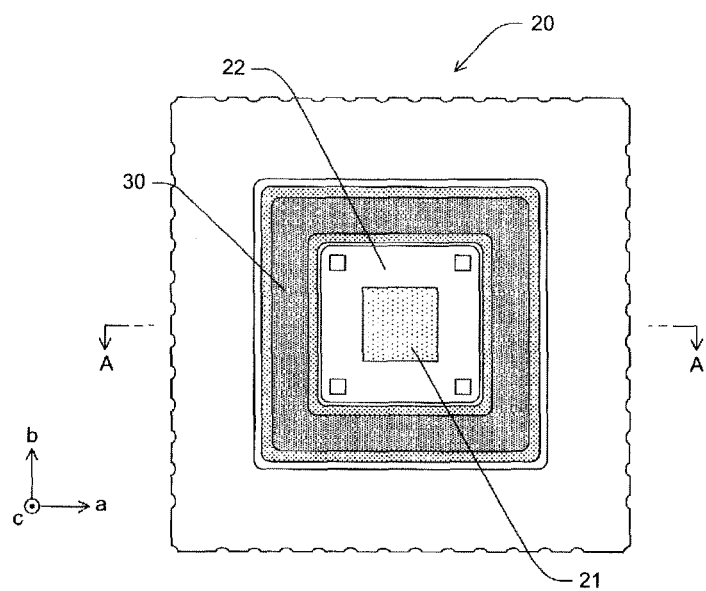
FIG. 12 is a view for explaining a metal ring.
Figure 13:
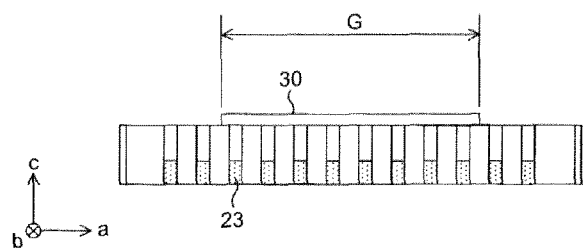
FIG. 13 is a side view of FIG. 12.
Figure 14:
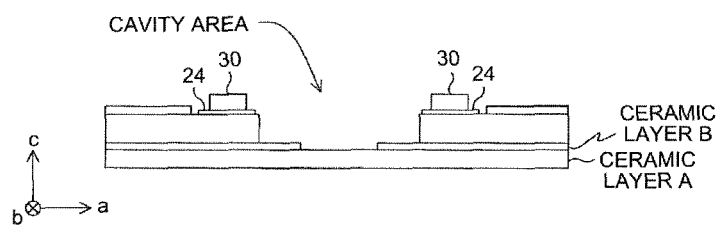
FIG. 14 is a sectional view along line A-A of FIG. 12.

As illustrated in FIG. 12 to FIG. 14, for example, the metal ring 30 is attached on the positive side in the c-axis direction of the gold-plated portion 24. The metal ring 30 is a metal member in an approximately square shape with an opening formed in a manner surrounding the cavity area. A side length G of the metal ring 30 is set to, for example, approximately 10 mm.

The metal ring 30 is made of kovar with a coefficient of thermal expansion similar to that of ceramic that is a material of the flat package 20. The surface of the metal ring 30 is plated with gold. The metal ring 30 is fixed to the gold-plated portion 24 using silver solder.

Figure 15:
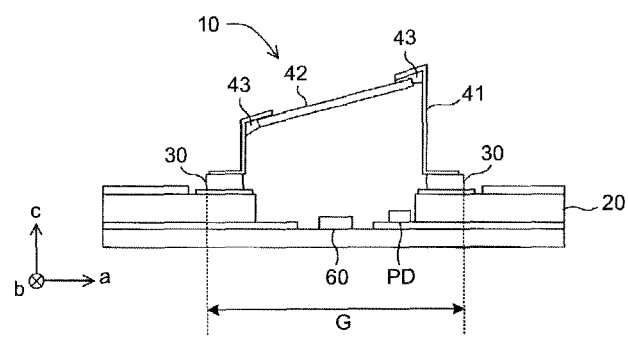
FIG. 15 is a first view for explaining a cap.
Figure 16A:
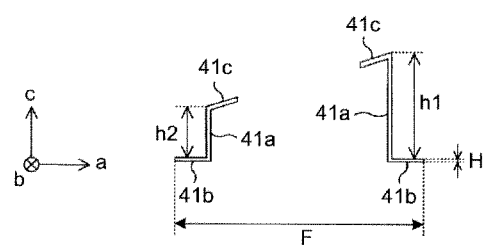
FIG. 16A and FIG. 16B are second views for explaining the cap.
Figure 16B:
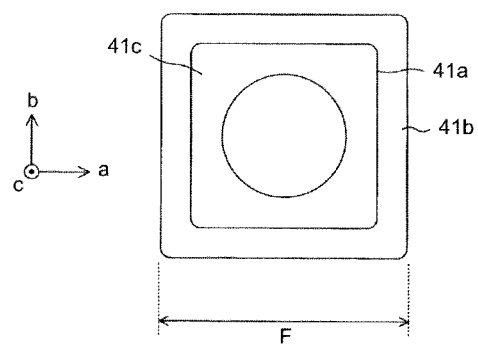

As illustrated in FIG. 15, for example, the cap 40 includes a cap main body 41 made of metal and a glass plate 42 that transmits light. As illustrated in FIG. 16A and FIG. 16B, the cap main body 41 includes a standing portion 41a extending in the c-axis direction, a flange 41b provided to an end on the negative side in the c-axis direction of the standing portion 41a, and a tilting portion 41c provided to an end on the positive side in the c-axle direction of the standing portion 41a. In FIG. 16A, for example, a reference numeral H represents 0.1 mm, a reference numeral h1 represents 2.5 mm, a reference numeral h2 represents 0.5 mm. And, a reference numeral F represents the same size as the above G size or 0.2 to 0.5 mm smaller than the G size so as to obtain good seam welding.

The flange 41b is a portion in a flat shape connected to the metal ring 30. The tilting portion 41c is a portion to which the glass plate 42 is attached. The glass plate 42 is attached to the tilting portion 41c in a manner tilted by a predetermined angle with respect to a plane orthogonal to the c-axis direction such that a light beam output from the surface-emitting laser array chip 60 and reflected by the glass plate 42 enters the photodiode PD. The tilt angle is set to approximately 15 degrees, for example.

On the surface of the glass plate 42, a reflective film that reflects 10% of incident light is formed on the negative side in the c-axis direction, and an antireflective film is formed on the positive side in the c-axis direction.

The glass plate 42 is fixed to the tilting portion 41c from the inside of the cap main body 41 by a low-melting-point glass 43 (refer to FIG. 13).

Figure 17:
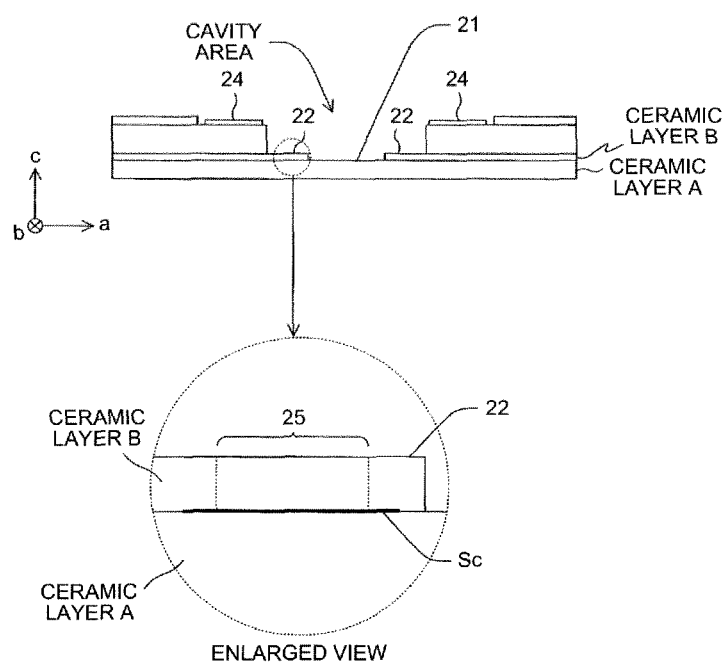
FIG. 17 is a view for explaining an opening 25 of a ceramic layer B.

A scale Sc is formed on a portion that can be observed through the opening 25 of the ceramic layer B on the surface of the positive side in the c-axis direction of the layer A (refer to FIG. 17).

Figure 18:
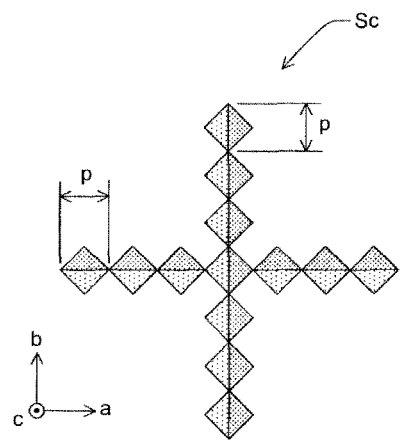
FIG. 18 is a view for explaining a scale Sc of a ceramic layer A.

A cross scale illustrated in FIG. 18 is used as the scale Sc. The cross scale is a sequential pattern of a triangle mark with a base length of p. The base length p set to 20 μm, for example.

Figure 19:
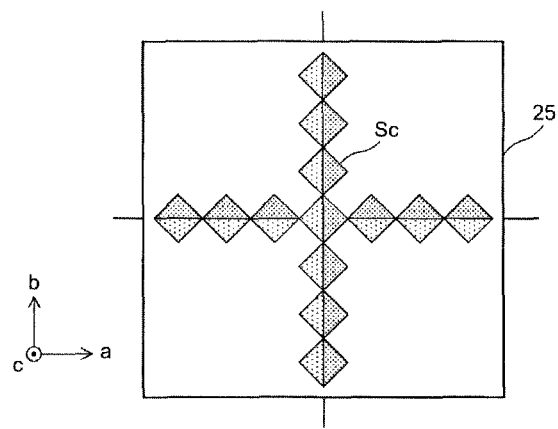
FIG. 19 is a view for explaining the scale observed through the opening 25 when no positional deviation occurs.

If the ceramic layer A and the ceramic layer B are formed exactly as designed, and no relative positional deviation occurs between the ceramic layer A and the ceramic layer B, the opening 25 and the scale Sc are arranged such that the center of the opening 25 coincides with the center of the scale Sc as illustrated in FIG. 19.

If the center of the opening 25 does not coincide with the center of the scale Sc, it is readily found that relative positional deviation occurs between the ceramic layer A and the ceramic layer B. Furthermore, this configuration facilitates deriving of information of the positional deviation (an amount of the positional deviation and a direction of the positional deviation).

Figure 20:
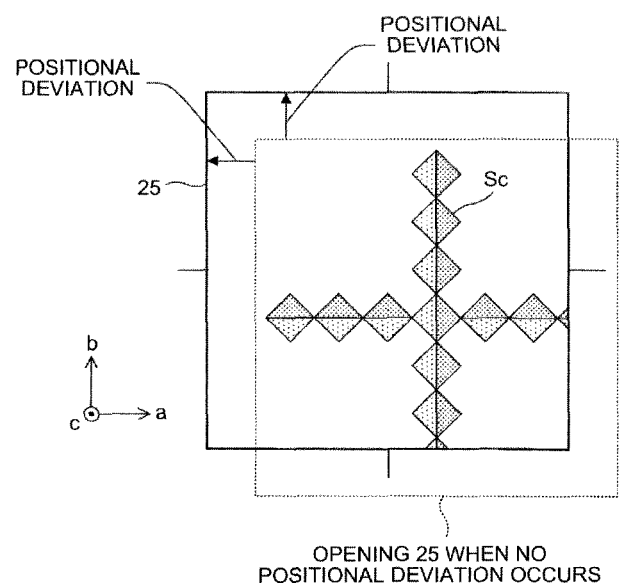
FIG. 20 is a view for explaining the scale observed through the opening 25 when positional deviation occurs.

In FIG. 20, for example, the ceramic layer B shifts with respect to the ceramic layer A by a distance p in the negative direction of the a-axis and a distance p in the positive direction of the b-axis.

Furthermore, the positional deviation information of the four openings facilitates deriving of information of rotational deviation (an angle of rotation and a direction of rotation) about an axis parallel to the c-axis direction of the ceramic layer B with respect to the ceramic layer A.

As a use of a package member, the package member that holds a light-emitting element includes a mounting portion on which the light-emitting element is mounted, a base body that includes a pair of metallization wiring members extending downward from the mounting portion or the periphery of the mounting portion, and a frame body that is stacked on the upper surface of the base body and to which an opening used for forming a cavity area is provided. A wiring pattern for supplying electricity to the light-emitting element is formed on the bottom surface of the cavity area by a plated metal layer.

The package member is manufactured in accordance with the following process.

A base body green sheet made of ceramic is prepared, and a through hole through which the metallization wiring members are passed is bored in the base body green sheet.

A frame body green sheet made of ceramic is also prepared, and a through hole serving as a cavity area is bored in the frame body green sheet.

Subsequently, metal paste for a metallization wiring member is applied to the upper surface and the lower surface of the base body green sheet by a screen-printing method, for example. The metal paste is obtained by kneading metal powder, such as tungsten and molybdenum, an organic binder, and a solvent, for example.

Furthermore, the metal paste for a metallization metal layer is applied to the inner surface of the through hole of the frame body green sheet by a screen-printing method, for example. To perform printing on a through hole, a method for printing the inside of a through hole by applying metal paste on one end of the through hole and sucking the metal paste from the other end the through hole is typically employed.

The frame body green sheet is placed on the base body green sheet to manufacture a ceramic substrate by applying heat and pressure. The ceramic substrate is then baked at higher temperature.

Subsequently, the exposed surfaces of the mounting portion, the metallization wiring conductor, and the metallization metal layer are plated with nickel or silver, for example.

Examples of the light-emitting element held by the package member thus manufactured include a VCSEL. A VCSEL is a semiconductor laser that outputs light in a direction orthogonal to the surface of a substrate. A VCSEL achieves high performance at low cost, and facilitates arrangement thereof in array compared with a conventional edge-emitting laser. Therefore, it is suggested that a VCSEL be used as a light source for optical communications, such as optical interconnections, a light source for light pickup, and a light source for an image forming apparatus, such as a laser printer. Some of them have already been put into practical use.

In an image forming apparatus, the amount of light of a scanning light beam changes in association with change in temperature and change over time. As a result, an uneven density may possibly occur in an image output finally (an output image). To suppress this, an optical scanning device usually causes a detector, such as a photodiode, to receive a part of the light beam output from a light source as a monitoring light beam, and performs auto power control (APC) for controlling the output level of the light source based on the result.

An optical scanning device using an edge-emitting laser monitors light output rearward from the edge-emitting laser to perform APC. By contrast, a surface-emitting laser generates no light output rearward because of its configuration. Therefore, for an optical scanning device using a surface-emitting laser, there has been developed a method for splitting a part of the light beam output from the surface-emitting laser and guiding the part of the light beam to a photodetector to perform APC based on the output of the photodetector.

Figure 21:
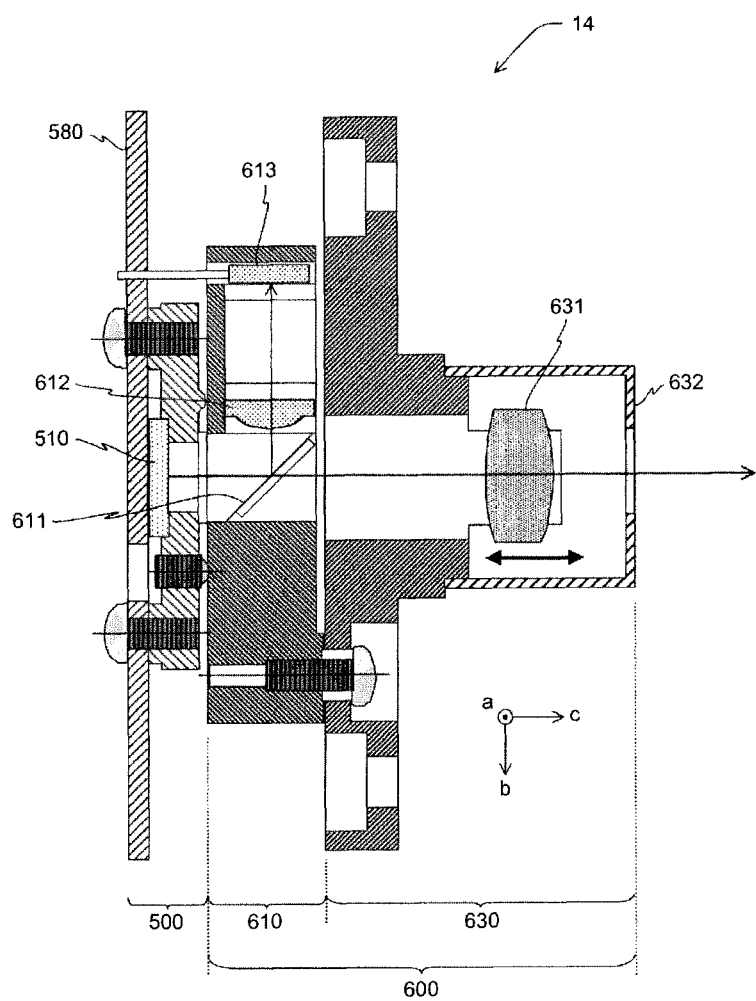
FIG. 21 is a view for explaining a conventional light source unit.

FIG. 21 is a schematic of a conventional light source unit 14 including a laser module 500 and an optical module 600.

The laser module 500 includes an optical device 510, a laser control device (not illustrated) that controls to drive the optical device 510, and a printed circuit board (PCB) 580 on which the optical device 510 and the laser control device are mounted.

The optical module 600 is formed of a first section 610 and a second section 630. The first section 610 includes a half mirror 611, a condensing lens 612, and a light-receiving element 613. The second section 630 includes a coupling lens 631 and an aperture plate 632.

The first section 610 is arranged on the positive side in the c-axis direction of the optical device 510 such that the half mirror 611 is positioned on the optical path of light output from the optical device 510. A part of the light incident on the half mirror 611 is reflected in the negative direction of the b-axis, and is received by the light-receiving element 613 through the condensing lens 612. The light-receiving element 613 outputs a signal (a photoelectric conversion signal) corresponding to the amount of received light to the laser control device of the laser module 500.

The second section 630 is arranged on the positive side in c-axis direction of the first section 610 such that the coupling lens 631 is positioned on the optical path of light passing through the half mirror 611. The coupling lens 631 makes the light passing through the half mirror 611 approximately parallel. The aperture plate 632 has an aperture, and shapes the light passing through the coupling lens 631. The light passing through the aperture of the aperture plate 632 is light output from the light source unit 14.

The light source unit 14, however, is expensive to manufacture.

To address this, there has been developed a method for reflecting a part of the light beam output from a surface-emitting laser element by the surface of a tilted transparent member to use the part of the light beam as a monitoring light beam. In this case, a photodiode that receives the monitoring light beam can be housed in a cavity area of a package member together with the surface-emitting laser element.

In this case, to cause the monitoring light beam reflected by the surface of the transparent member to enter the photodiode, the positional relationship between the surface-emitting laser element and the photodiode is extremely important.

The package member has a structure in which a plurality of ceramic members are stacked. If the surface-emitting laser element and the photodiode are mounted on different ceramic layers, the positional relationship between the surface-emitting laser element and the photodiode may possibly be different from their intended positional relationship because of relative positional deviation (layer deviation) between the ceramic layers.

In particular, a surface-emitting laser array including a plurality of light-emitting elements needs to cause monitoring light beams for all the light-emitting elements to enter the photodiode accurately. Therefore, deviation in the positional relationship between the surface-emitting laser array and the photodiode directly leads to fluctuation in the amount of light beams output from the light-emitting elements. Furthermore, if deviation occurs in the positional relationship between the surface-emitting laser array and the photodiode, the signal level of a signal output from the photodiode varies for each light-emitting element. As a result, efficient and stable APC fails to be performed.

Examples of the light-emitting element also include a light-emitting element for optical communications. If a light-emitting element is mounted on a lower ceramic layer and a fixing member that guides light to an optical fiber is mounted on an upper ceramic layer, the light output from the light-emitting element needs to be guided accurately to the optical fiber from the fixing member. Thus, also in this case, the relative positional relationship between the upper ceramic layer and the lower ceramic layer is extremely important.

The ceramic laminate manufactured by the manufacturing method disclosed in Japanese Patent Application Laid-open No. 2002-178325 fails to derive the positional relationship between the inner layer and the outer layer.

The layered substrate disclosed in Japanese Patent No. 2977698 determines whether layer deviation falls within a predetermined range using a check mark for detecting layer deviation, and fails to derive positional deviation information.

The method for detecting layer deviation disclosed in Japanese Patent Application Laid-open No. 6-302716 determines whether deviation in the rotation direction and the lateral direction falls within a permissible deviation amount, and fails to derive positional deviation information and rotational deviation information.

The layered substrate disclosed in Japanese Patent Application Laid-open No. 11-274670 fails to quantitatively deriv positional deviation information.

By contrast, the flat package 20 according to the present embodiment facilitates quantitative deriving of positional deviation information and rotational deviation information between the ceramic layer A and the ceramic layer B.

Figure 22:
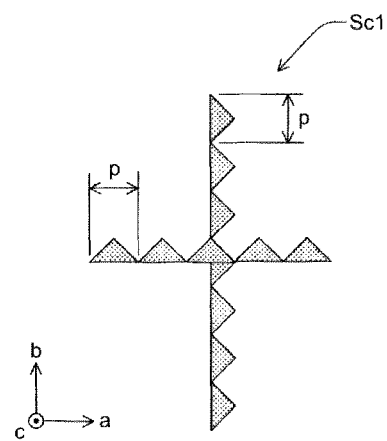
FIG. 22 is a view for explaining a scale Sc1 of a first modification.
Figure 23:
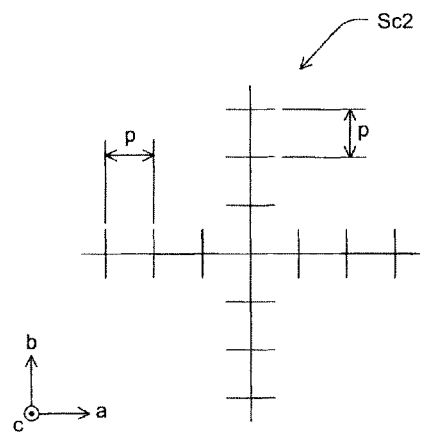
FIG. 23 is a first view for explaining a scale Sc2 of a second modification.
Figure 24:
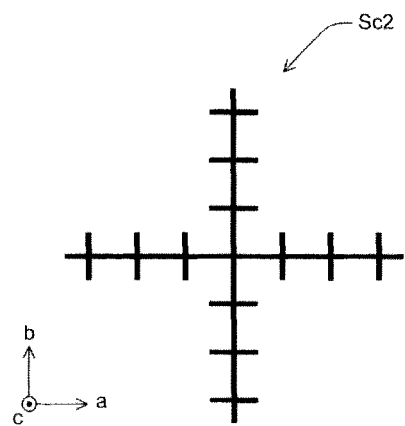
FIG. 24 is a second view for explaining the scale Sc2 of the second modification.

FIG. 22 is a schematic of a scale Sc1 of a first modification, and FIG. 23 is a schematic of a scale Sc2 of a second modification. In the scale Sc2, if a small value is set to p, the line width of each graduation looks relatively thick as illustrated in FIG. 24, for example. As a result, accuracy of the positional deviation information may possibly deteriorate. To address this, the scale Sc or the scale Sc1 is preferably used in this case.

Figure 25:
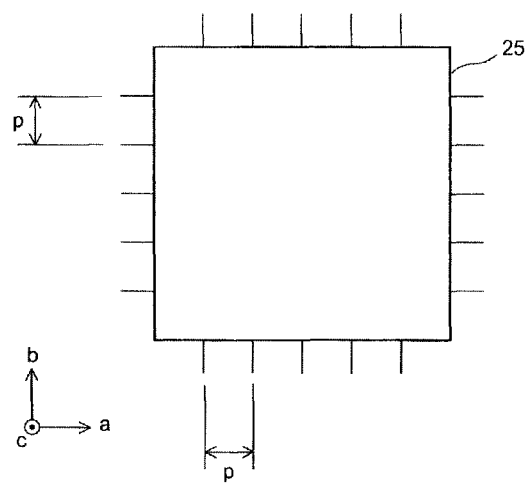
FIG. 25 is a view for explaining a scale provided around the opening.
Figure 26A:
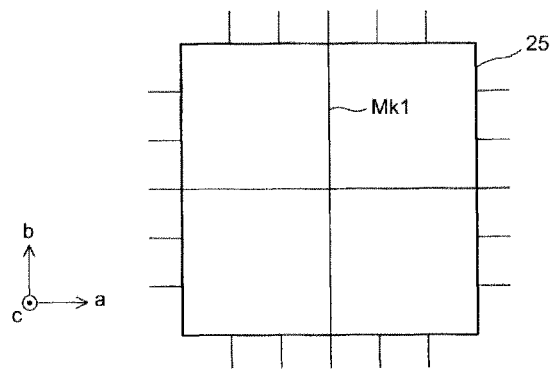
FIG. 26A and FIG. 26B are views for explaining a cross mark Mk1.
Figure 26B:
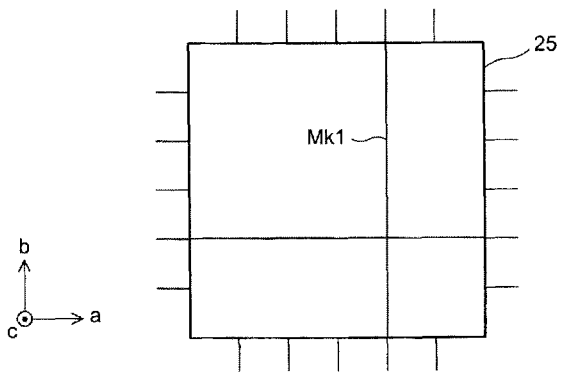

As illustrated in FIG. 25, for example, a scale may be provided around at least one of the openings 25. In this case, as illustrated in FIG. 26A and FIG. 26B, for example, a cross mark Mk1 may be used instead of the scale corresponding to the opening 25 on the ceramic layer A. In FIG. 26A, no positional deviation occurs. By contrast, in FIG. 26B, the ceramic layer B shifts with respect to the ceramic layer A by a distance p in the negative direction of the a-axis and a distance p in the positive direction of the b-axis.

Figure 27A:
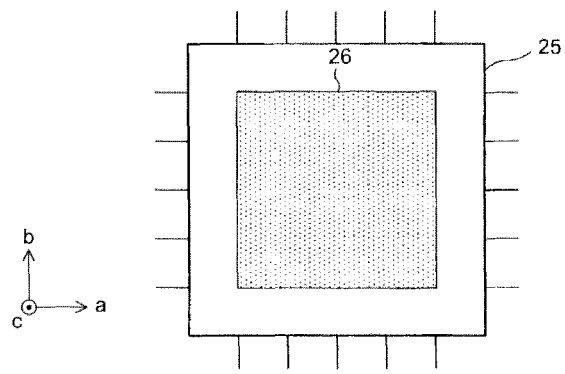
FIG. 27A and FIG. 27B are views for explaining an opening 26 of the ceramic layer A.
Figure 27B:
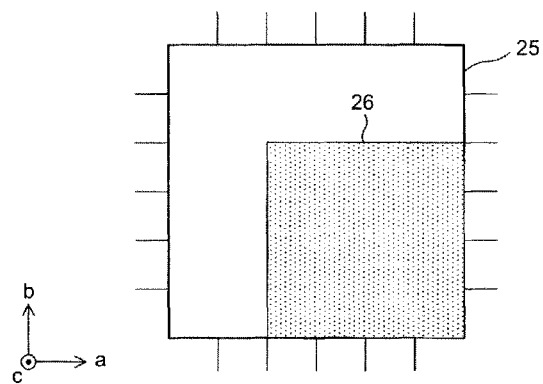

As illustrated in FIG. 27A and FIG. 27B, for example, the ceramic layer A may have an opening 26 instead of a scale in a manner corresponding to one of the openings 25. In FIG. 27A, no positional deviation occurs. By contrast, in FIG. 27B, the ceramic Layer B shifts with respect to the ceramic layer A by a distance p in the negative direction of the a-axis and a distance p in the positive direction of the b-axis. The side length of the opening 25 may be set to 100 µm, the side length of the opening 26 may be set to 80 µm, and the value of p may be set to 10 µm, for example.

While the explanation has been made of the case where the opening 25 is larger than the opening 26, for example, the opening 25 may be the same size as that of the opening 26. Alternatively, the opening 26 may be larger than the opening 25. Furthermore, a recess having the same outline as that of the opening 26 may be provided to the ceramic layer A instead of the opening 26.

Figure 28A:
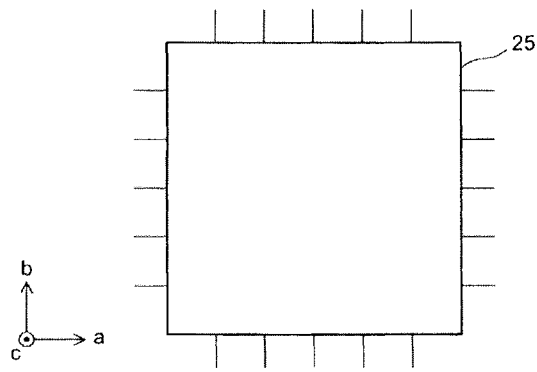
FIG. 28A and FIG. 28B are views for explaining a mark Mk2 in the same shape and the same size as those of the opening 25.
Figure 28B:
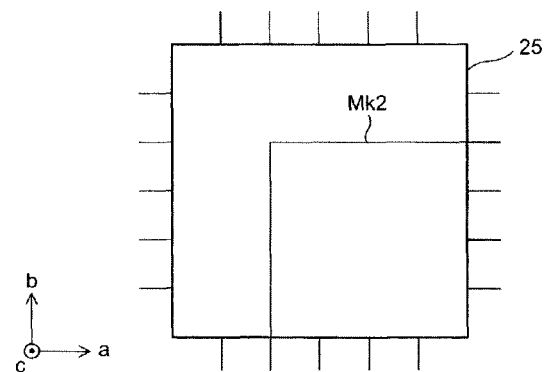

A mark (referred to as a mark Mk2) in the same shape and the same size as those of the opening 25 may be formed on the ceramic layer A instead of a scale in a manner corresponding to one of the openings 25. In FIG. 28A, no positional deviation occurs. By contrast, in FIG. 28B, the ceramic layer B shifts with respect to the ceramic layer A by a distance p in the negative direction of the a-axis and a distance p in the positive direction of the b-axis. In this case, occurrence of positional deviation can be readily found.

Figure 29:
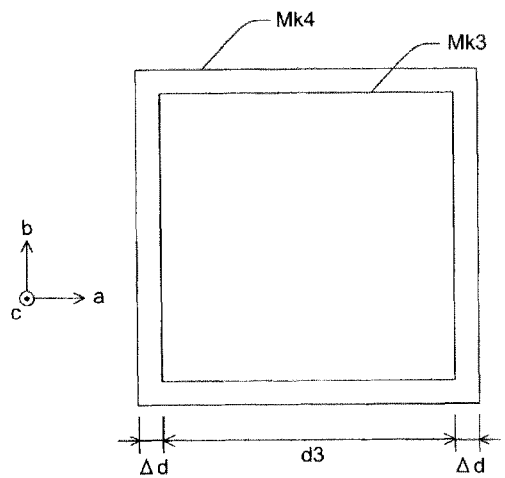
FIG. 29 is a view for explaining a mark Mk3 and a mark Mk4.
Figure 30:
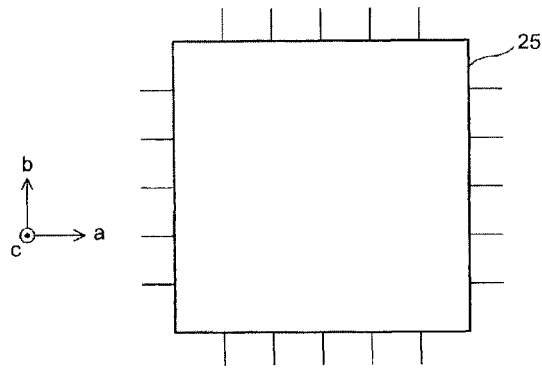
FIG. 30 is a view for explaining a scale observed through the opening 25 when the mask Mk3 and the mark Mk4 are used and no positional deviation occurs.
Figure 31A:
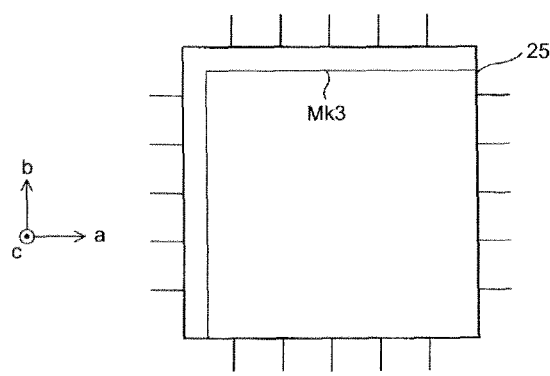
FIG. 31A and FIG. 31B are views for explaining the scale observed through the opening 25 when the mask Mk3 and the mark Mk4 are used and positional deviation occurs.
Figure 31B:
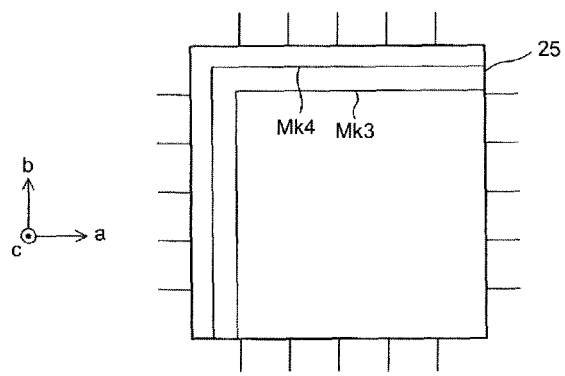

As illustrated in FIG. 29, a mark Mk3 in the same shape and the same side length d3 as those of the opening 25 and a mark Mk4 that is similar to the mark Mk3 and whose side length is longer than that of the mark Mk3 by 2Δd may be formed on the ceramic layer A instead of a scale in a manner corresponding to one of the openings 25. In FIG. 30, no positional deviation occurs. In this case, the approximate magnitude of positional deviation can be readily determined. In FIG. 31A, the ceramic layer B shifts with respect to the ceramic layer A by an amount smaller than a distance Δd in the negative direction of the a-axis and by an amount smaller than a distance Δd in the positive direction of the b-axis. By contrast, in FIG. 31B, the ceramic layer B shifts with respect to the ceramic layer A by an amount equal to or larger than a distance Δd in the negative direction of the a-axis and by an amount equal to or larger than a distance Δd in the positive direction of the b-axis. The side length of the opening 25 may be set to 80 µm, the side length d3 of the mark Mk3 may be set to 80 µm, and the side length of the mark Mk4 may be set to 100 µm, for example. In this case, the value of Δd is 10 µm.

The size of the mark Mk3 may be different from that of the opening 25. Furthermore, three or more marks of different sizes may be provided.

Figure 32:
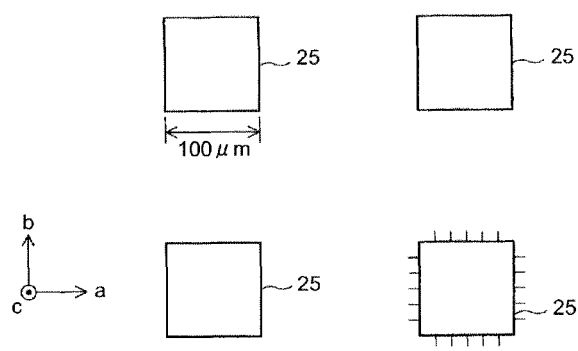
FIG. 32 is a view for explaining the case where a scale is provided around one of four openings 25.

The scale may be provided around any one of the openings 25 of the ceramic layer B (refer to FIG. 32).

Figure 33:
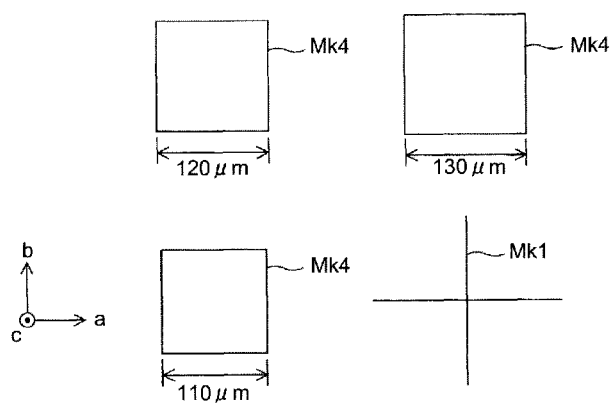
FIG. 33 is a view for explaining marks formed at portions corresponding to the four openings 25 on the ceramic layer A.
Figure 34A:
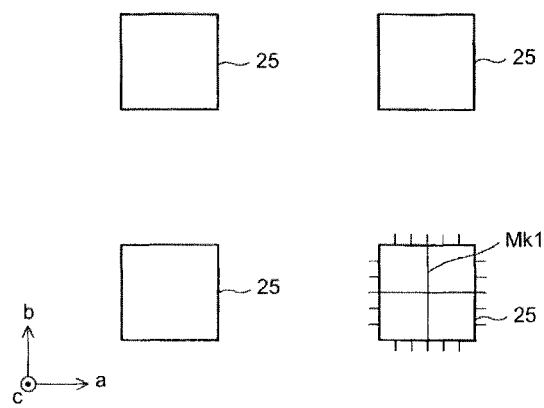
FIG. 34A is a view for explaining the marks observed through the four openings 25 when no positional deviation occurs.
Figure 34B:
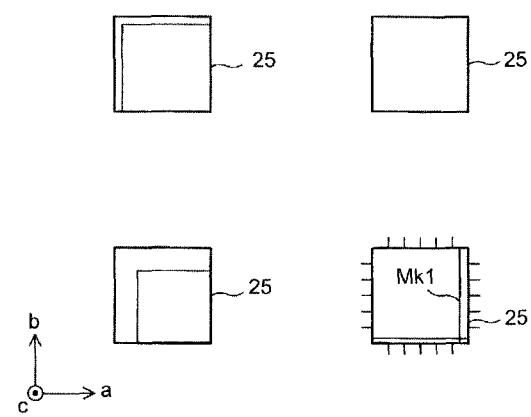
FIG. 34B is a view for explaining the marks observed through the four openings 25 when positional deviation occurs.

As illustrated in FIG. 33, for example, the marks corresponding to the four openings 25 may be different from one another on the ceramic layer A. In FIG. 34A, no positional deviation occurs when the ceramic layer A is stacked on the ceramic layer B. By contrast, in FIG. 34B, the ceramic layer B shifts with respect to the ceramic layer A by an amount equal to or larger than 20 μm in the negative direction of the a-axis and by an amount equal to or larger than 20 μm in the positive direction of the b-axis.

In this case, if the ceramic layer B shifts by 5 to 10 μm in the positive direction of the b-axis and by 5 to 10 μm in the negative direction of the a-axis, a mark can be seen only through the lower left opening. If the ceramic layer B shifts by 10 to 20 μm in the positive direction of the b-axis and by 10 to 20 μm in the negative direction of the a-axis, marks can be seen through the two openings on the left. Furthermore, it is possible to derive a deviation amount between the pattern on the ceramic layer A and the pattern on the ceramic layer B through the lower right opening.

Figure 35A:
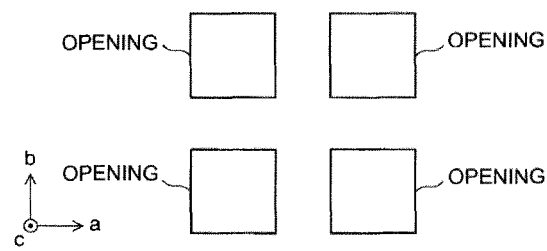
FIG. 35A is a view for explaining four openings.
Figure 35B:
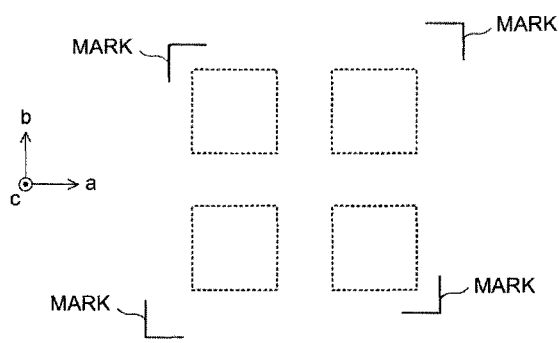
FIG. 35B is a view for explaining marks formed further outside of the openings in a manner separated therefrom by a certain distance.

The ceramic layer B having four openings of the same size (refer to FIG. 35A) may be stacked on the ceramic layer A having four marks formed outside of the positions corresponding to the four openings in a manner separated therefrom by a certain distance (refer to FIG. 35B).

Figure 35C:
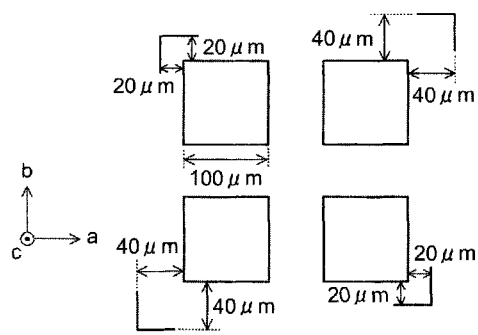
FIG. 35C is a view for explaining a positional relationship between the openings and the marks.

As illustrated in FIG. 35C, for example, each of the openings in FIG. 35A is a square with a side length of 100 μm. The upper left mark in FIG. 35B is positioned outside of the upper left corner of the upper left opening in FIG. 35A by 20 μm, the upper right mark is positioned outside of the upper right corner of the upper right opening by 40 μm, the lower right mark is positioned outside of the lower right corner of the lower right opening by 20 μm, and the lower left mark is positioned outside of the lower left corner of the lower left opening by 40 μm.

Figure 36A:
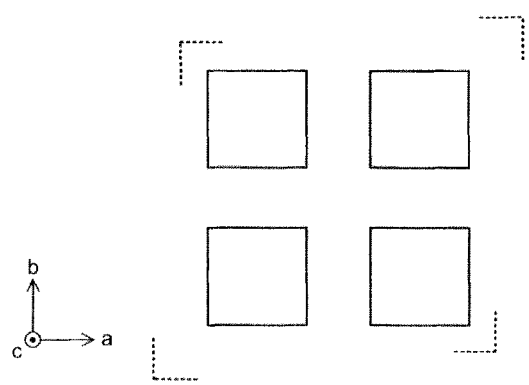
FIG. 36A is a view for explaining a state in which no positional deviation occurs between two layers including the openings in FIG. 35A and the marks in FIG. 35B.

In FIG. 36A, no deviation occurs between the two layers when the two layers are viewed from the top with the ceramic layer B stacked on the ceramic layer A. If no deviation occurs between the two layers, the marks cannot be seen through the openings. The marks represented by dashed lines indicate that the marks are not actually seen.

Figure 36B:
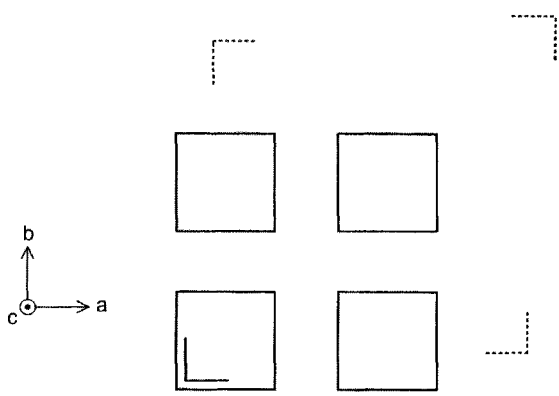
FIG. 36B is a view for explaining a state in which positional deviation occurs between the two layers.

In FIG. 36B, the ceramic layer B shifts with respect to the ceramic layer A by an amount equal to or larger than 30 μm in the negative direction of the a-axis and by an amount equal to or larger than 30 μm in the negative direction of the b-axis when the two layers are viewed from the top with the ceramic layer B stacked on the ceramic layer A. At this time, while the lower left mark can be seen through the corresponding opening, the lower right mark cannot be seen through the corresponding opening. Thus, it is found that deviation of equal to or larger than 20 μm and equal to or smaller than 40 μm occurs.

Using a plurality of openings and marks corresponding thereto in this manner, it is possible to check the amount and the direction of deviation at a glance.

Figure 37A:
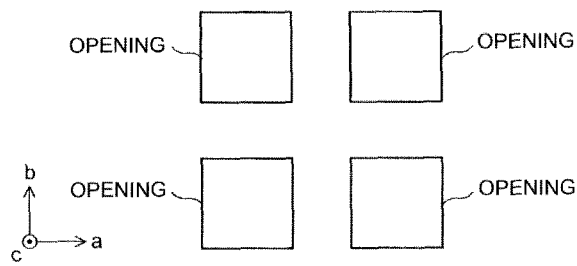
FIG. 37A is a view for explaining four openings.
Figure 37B:
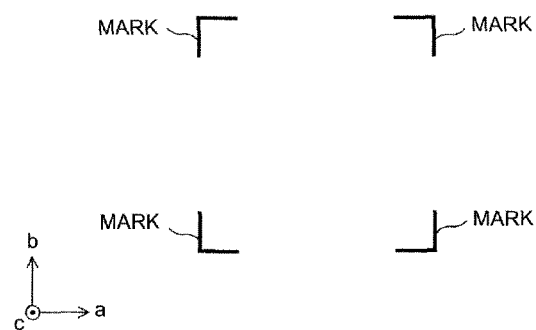
FIG. 37B is a view for explaining marks arranged in a manner coming into contact with the openings from inside.

The ceramic layer B having four openings of the same size (refer to FIG. 37A) may be stacked on the ceramic layer A having marks arranged at positions corresponding to the openings in a manner coming into contact with the openings from inside (refer to FIG. 37B).

Figure 37C:
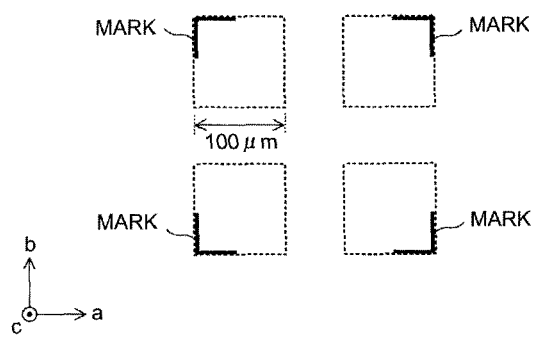
FIG. 37C is a view for explaining a positional relationship between the openings and the marks.

As illustrated in FIG. 37C, for example, each of the openings in FIG. 37A is a square with a side length of 100 μm. The upper left mark in FIG. 37B is in contact with the upper left corner of the upper left opening in FIG. 37A, the upper right mark is in contact with the upper right corner of the upper right opening, the lower right mark is in contact with the lower right corner of the lower right opening, and the lower left mark is in contact with the lower left corner of the lower left opening.

Figure 38A:
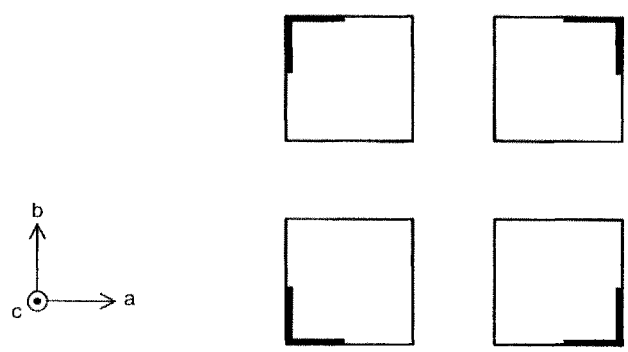
FIG. 38A is a view for explaining a state in which no positional deviation occurs between two layers including the openings in FIG. 37A and the marks in FIG. 37B.

In FIG. 38A, no deviation occurs between the two layers when the two layers are viewed from the top with the ceramic layer B stacked on the ceramic layer A.

Figure 38B:
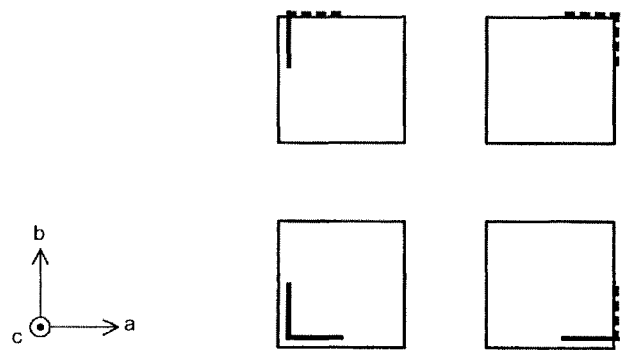
FIG. 38B is a view for explaining a state in which positional deviation occurs between the two layers.
Figure 39:
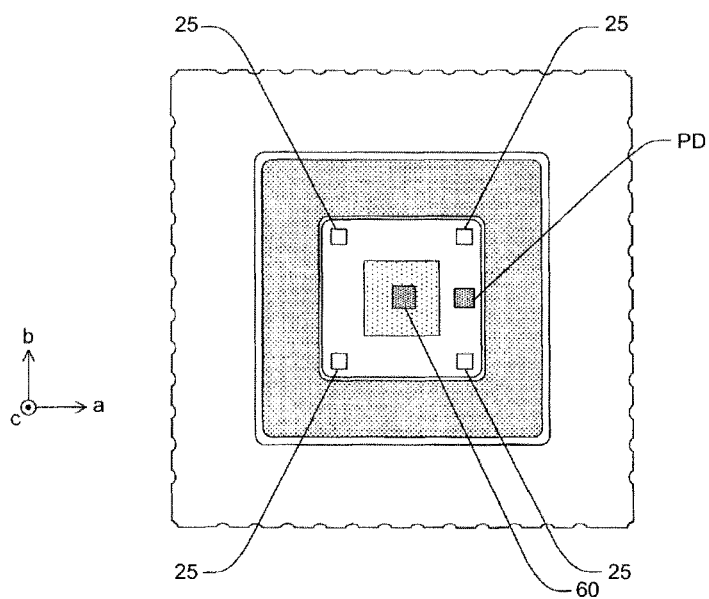
FIG. 39 is a view for explaining a state in which a surface-emitting laser array chip 60 and a photodiode PD are mounted on the flat package.

In FIG. 38B, the ceramic layer B shifts with respect to the ceramic layer A by an amount equal to or larger than 30 μm in the negative direction of the a-axis and by an amount equal to or larger than 30 μm in the negative direction of the b-axis when the two layers are viewed from the top with the ceramic layer B stacked on the ceramic layer A. At this time, at the lower left corner of the lower left opening, a gap between the corner and the mark can be seen. At the other openings, the corresponding marks are hidden below the openings and cannot be seen. The marks represented by dashed lines indicate that the marks are not actually seen. At this time, if the line width of the marks is set to 20 μm, it can be found that deviation of equal to or larger than 20 μm occurs because the whole mark is hidden at the upper right opening.

Using a plurality of openings and marks corresponding thereto in this manner, it is possible to check the amount and the direction of deviation at a glance.

In other words, a plurality of openings and a plurality of marks corresponding to the openings may be formed, and the marks may have different positional relationships with the openings corresponding thereto from one another and different directivities from one another.

Furthermore, the openings may have different sizes from one another.

As described above, by providing a plurality of openings having different functions and through which marks can be observed, it is possible to determine the type and the degree of a defect of a package member in an automatic visual inspection by image recognition, for example, in a simple manner. Furthermore, in accordance with required accuracy, the opening 25 to be observed can be selected.

In the present embodiment, positional deviation information and rotational deviation information of the ceramic layer B with respect to the ceramic layer A are obtained before the photodiode PD is attached. Based on the positional deviation information and the rotational deviation information thus obtained, the position of the photodiode PD is derived such that most of the light beam (monitoring light beam) output from the surface-emitting laser array chip 60 and reflected by the surface of the glass plate 42 enters the photodiode PD. Subsequently, the photodiode PD is attached to the position (refer to FIG. 39).

Figure 40A:
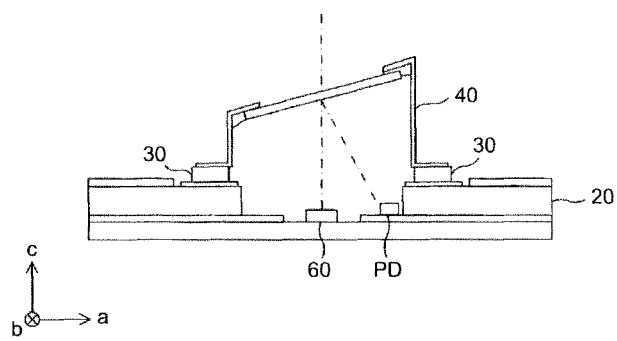
FIG. 40A and FIG. 40B are views for explaining adjustment of the position of the cap.
Figure 40B:
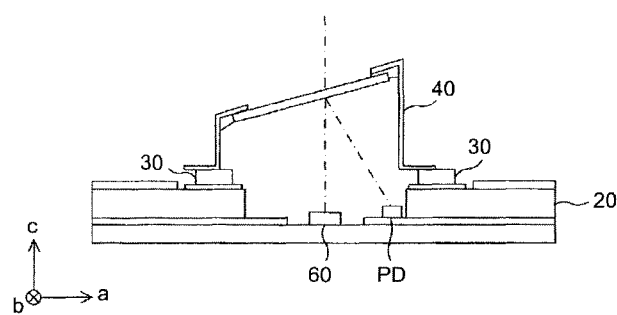

If the ceramic layer B shifts with respect to the ceramic layer A only in the a-axis direction, the position of the cap 40 in the a-axis direction may be adjusted instead of adjusting the position of the photodiode PD (refer to FIG. 40A and FIG. 40B).

The scanning control, device performs APC on each of the light-emitting elements at a predetermined timing based on a signal output from the photodiode PD.

As described above, the flat package 20 according to the present embodiment is a ceramic package that includes the chip mounting portion 21, the PD mounting portion 22, the connecting terminals 23, and the gold-plated portion 24.

The chip mounting portion 21 is a portion on which the surface-emitting laser array chip 60 is mounted on the ceramic layer A.

The PD mounting portion 22 is provided to the ceramic layer B stacked on the positive side in the c-axis direction of the ceramic layer A. The openings 25 are formed at the four corners of the PD mounting portion 22.

The scale Sc is formed on a portion that can be observed through the opening 25 of the ceramic layer B on the surface of the positive side in the c-axis direction of the ceramic layer A.

In this case, it is possible to quantitatively derive positional deviation information and rotational deviation information of the ceramic layer B with respect to the ceramic layer A in a simple manner without increasing cost.

Based on the positional deviation information and the rotational deviation information of the ceramic layer B with respect to the ceramic layer A, at least one of the position of the photodiode PD and the position of the cap 40 is adjusted such that most of the monitoring light beam enters the photodiode PD.

Accordingly, the scanning control device can perform APC on each of the light-emitting elements accurately.

If positional deviation and rotational deviation of the ceramic layer B with respect to the ceramic layer A are large, the flat package can be eliminated as a defective before the surface-emitting laser array chip 60 and the photodiode PD are attached thereto. This configuration facilitates determination performed by an automatic visual inspection device, thereby reducing trouble and cost of the determination significantly.

In a ceramic package member obtained by stacking green sheets, an error of approximately ±30 µm occurs even in alignment of layers with high accuracy, and larger deviation may possibly occur in some cases. An error of 30 µm has a large influence on a package member in which a plurality of electronic components, optical components in particular, are mounted on different layers, thereby decreasing the quality of the product.

An electronic component is mounted on a package member frequently using a pattern provided on the package member as a guide. In a conventional package member, if deviation occurs between layers of the package member, the relative distance between the patterns needs to be measured with an inspection device and an optical microscope to find how large deviation occurs in the positional relationship between two or more electronic components mounted on different layers. Thus, the measurement requires a lot of trouble and cost.

The optical device 10 according to the present embodiment includes the flat package 20. Therefore, even if deviation occurs between the ceramic layer that holds the surface-emitting laser array chip 60 and the ceramic layer that holds the photodiode PD, the optical device 10 can cause most of the light beam (monitoring light beam) output from the surface-emitting laser array chip 60 and reflected by the surface of the glass plate 42 to enter the photodiode PD.

Accordingly, the optical scanning device 2010 can perform APC on each of the light-emitting elements accurately at a predetermined timing based on a signal output from the photodiode PD.

The color printer 2000 includes the optical scanning device 2010. As a result, the color printer 2000 can form high-quality images without increasing cost.

While the explanation has been made of the case where the four openings 25 are formed at the four corners in the embodiment, it is not limited thereto.

While the explanation has been made of the case where the number of openings 25 is four in the embodiment, it is not limited thereto. As the number of openings 25 is increased, more detailed information can be obtained. However, too many openings 25 make the information complicated and make designing of the space in the package member difficult. Therefore, it is preferable that the number of opening 25 be approximately four.

While the explanation has been made of the positional deviation between two ceramic layers in the embodiment, it is not limited thereto. For example, positional deviation among three ceramic layers can also be derived.

Similarly to the embodiment, it is possible to check deviation in ceramic layers and printing deviation in patterns simultaneously. In other words, by forming an opening in an upper layer and observing the positional relationship between a pattern around the opening and a pattern on a lower layer that can be seen through the opening, it is possible to determine the deviation amount between the patterns at a glance. Furthermore, it is possible to determine the positional relationship between electronic components.

While the explanation has been made of the case where the emission wavelength of the light-emitting element is 780 nm band, it is not limited thereto. In accordance with characteristics of the photosensitive elements, the emission wavelength of the light-emitting element may be changed.

The optical device described above can be used for intended uses other than an image forming apparatus. In this case, the emission wavelength may be set to 650 nm band, 850 nm band, 980 nm band, 1.3 µm hand, or 1.5 µm band, for example, depending on the intended uses.

While the explanation has been made of the case where the image forming apparatus is a color printer, it is not limited thereto. Alternatively, the image forming apparatus may be a monochrome printer.

While the explanation has been made of the image forming apparatus that transfers a toner image onto a recording sheet, it is not limited thereto. Alternatively, the image forming apparatus may be an image forming apparatus directly irradiating a medium (e.g., a sheet) that presents colors through application of laser light with laser light, for example.

The present image forming apparatus may be an image forming apparatus using a silver halide film as an image carrier. In this case, acre is formed on a silver halide film by optical scanning, and can be developed by processing similar to developing in a normal silver halide photographic process. The image can be transferred onto photographic paper by processing similar to printing in the normal silver halide photographic process. Such an image forming apparatus can be applied to an optical photoengraving apparatus and an optical printing apparatus that depicts a computed tomography (CT) scan image, for example.

The package member according to the embodiment of the present invention can facilitate quantitative deriving of positional deviation between layers.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A package member comprising:
   stacked ceramic layers including at least a first ceramic layer and a second ceramic layer stacked on the first ceramic layer, on which an electronic component is to be mounted,
   at least one mark that is formed on the first ceramic layer, and
   at least one portion that is provided to the second ceramic layer and that defines an opening disposed and configured to allow observation of the at least one mark and an amount of position deviation between the at least one mark and a reference position of the opening,
   wherein the mark is larger than the opening or is formed further outside of the opening.

2. A package member comprising:
   stacked ceramic layers including at least a first ceramic layer and a second ceramic layer stacked on the first ceramic layer, on which an electronic component is to be mounted, at least one mark for detecting a position being formed on the first ceramic layer, and at least one portion defining an opening for observing the at least one mark being provided to the second ceramic layer, wherein the mark is larger than the opening or is formed further outside of the opening.

3. The package member according to claim 1, wherein the mark is formed in a manner coming into contact with at least one side of the opening from inside, and is seen through the opening.

4. The package member according to claim 1, wherein the mark is a cross scale with graduations arranged at regular intervals.

5. The package member according to claim 4, wherein the graduations are in a triangle shape.

6. The package member according to claim 1, wherein the mark is a portion defining an opening.

7. The package member according to claim 1, wherein the mark includes a pattern in the same shape as that of the opening.

8. The package member according to claim 1, wherein graduations are formed near the opening at regular intervals.

9. The package member according to claim 1, wherein the at least one portion defining an opening is a plurality of portions each defining an opening, the at least one mark is a plurality of marks corresponding to the openings, and the marks have different positional relationships with the openings corresponding thereto from one another and different directivities from one another.

10. An optical device comprising:

a package member comprising a stacked ceramic layers including at least a first ceramic layer and a second ceramic layer stacked on the first ceramic layer, at least one mark for detecting a position being formed on the first ceramic layer, and at least one portion defining an opening for observing the at least one mark being provided to the second ceramic layer, a surface-emitting laser element provided to the first ceramic layer;

a transparent member that is tilted with respect to an output surface of the surface-emitting laser element and that reflects a part of light output from the surface-emitting laser element; and a photodiode that is provided to the second ceramic layer and that receives the light reflected by the transparent member.

11. The optical device according to claim 10, wherein the mark is larger than the opening or is formed further outside of the opening.

12. The optical device according to claim 10, wherein the mark is formed in a manner coming into contact with at least one side of the opening from inside, and is seen through the opening.

13. The optical device according to claim 10, wherein the mark is a cross scale with graduations arranged at regular intervals.

14. The optical device according to claim 13, wherein the graduations are in a triangle shape.

15. The optical device according to claim 10, wherein the mark is a portion defining an opening.

16. The optical device according to claim 10, wherein the mark includes a pattern in the same shape as that of the opening.

17. The optical device according to claim 10, wherein graduations are formed near the opening at regular intervals.

18. The optical device according to claim 10, wherein the at least one portion defining an opening is a plurality of portions each defining an opening, the at least one mark is a plurality of marks corresponding to the openings, and the marks have different positional relationships with the openings corresponding thereto from one another and different directivities from one another.

19. The optical device according to claim 10, wherein an optical axis is capable of being adjusted after the surface-emitting laser element and the photodiode are mounted.

* * * * *